United States Patent [19]
Bachmann

[11] Patent Number: 5,387,444
[45] Date of Patent: Feb. 7, 1995

[54] ULTRASONIC METHOD FOR COATING WORKPIECES, PREFERABLY USING TWO-PART COMPOSITIONS

[75] Inventor: Andrew G. Bachmann, Harwinton, Conn.

[73] Assignee: Dymax Corporation, Torrington, Conn.

[21] Appl. No.: 842,459

[22] Filed: Feb. 27, 1992

[51] Int. Cl.⁶ .............................................. B05D 1/40
[52] U.S. Cl. ................................. 427/600; 427/424; 427/426; 239/102.2; 118/313; 118/324
[58] Field of Search ............... 427/426, 421, 600, 424; 239/102.2, 102.1; 118/324, 313

[56] References Cited

U.S. PATENT DOCUMENTS

| | | | |
|---|---|---|---|
| 2,855,244 | 10/1958 | Camp | 239/102.2 |
| 2,881,092 | 4/1959 | Sedlacsik | 117/93 |
| 3,103,310 | 9/1963 | Lang | 239/102.2 |
| 3,114,654 | 12/1963 | Nishiyama et al. | 239/102.2 |
| 3,147,146 | 9/1964 | Sedlacsik | 118/627 |
| 3,198,170 | 8/1965 | Onishi | 239/102.2 |
| 3,232,540 | 2/1966 | Cassanmagnago | 239/418 |
| 3,356,061 | 12/1967 | Wiggins | 118/324 |
| 3,399,834 | 9/1968 | Bradley | 239/10 |
| 3,623,854 | 11/1971 | Frank | 427/424 |
| 3,950,574 | 4/1976 | Butler | 427/424 |
| 3,966,120 | 7/1976 | Furgalus | 239/102 |
| 4,460,619 | 7/1984 | Derks | 427/57 |
| 4,495,885 | 1/1985 | Derks | 118/241 |
| 4,659,014 | 4/1987 | Soth et al. | 239/102.2 |
| 4,806,455 | 2/1989 | LaBianca | 430/325 |
| 4,842,887 | 6/1989 | Bolte | 118/324 |
| 4,871,579 | 10/1989 | Bravet et al. | 427/424 |
| 4,988,543 | 1/1991 | Houle | 427/424 |
| 5,166,000 | 11/1992 | Singh et al. | 427/424 |

OTHER PUBLICATIONS

U.S. Statutory Invention Registration–No. H153 Published Nov. 14, 1986–Sadler et al–"Method For Applying Liquid to Yarn".

"Complexes In Free-Radical Polymerization"–Barton & Borsig–Polymer Science Library 6, Elsevier 1988–pp. 42–50 (no month date).

*Primary Examiner*—Shrive Beck
*Assistant Examiner*—Katherine A. Bareford
*Attorney, Agent, or Firm*—Ira S. Dorman

[57] ABSTRACT

A system and method for effecting the continuous, in-line coating of workpieces, freely supported upon a conveyor, utilizes an ultrasonic spray unit for delivery of a photo-polymerizable coating material. The deposited liquid is immediately irradiated to initiate curing, and the system and method are particularly well adapted for the formation of conformal coatings on printed circuit boards, utilizing two-part coating compositions.

15 Claims, 4 Drawing Sheets ns,387,444

ULTRASONIC METHOD FOR COATING WORKPIECES, PREFERABLY USING TWO-PART COMPOSITIONS

BACKGROUND OF THE INVENTION

This invention relates to the application and curing of liquid coating materials, so as to produce on workplaces surfaces of thermoset or thermoplastic synthetic resinous materials.

There are many circumstances under which it is desirable to apply automatically a polymerizable liquid coating material to a workpiece, and to effect immediately thereafter curing of the liquid to a solid state. One field in which such a technique is beneficially employed involves the production of conformal coatings upon various workplaces, perhaps most notably printed circuit boards and printed wiring assemblies.

To be entirely satisfactory from a commercial standpoint, any system that is offered for producing such coatings must be fast, reliable, economical, and environmentally sound. It must be sufficiently flexible to be readily accommodated in existing production lines, and it must be capable of producing, with sufficient precision to satisfy industry standards, uniform and void-free coatings.

Conformal coatings have been produced heretofore by use of so-called "selective curtain coaters." Such apparatus employs a coating head that shuttles at high speed from place-to-place relative to the workpiece, and that is selectively activated so as to preferentially discharge coating material upon specific areas of the surface. Because of the precision afforded, these coaters make unnecessary the masking of workpieces that might otherwise be required to maintain selected portions of their surfaces coating-free. As a consequence of this precision, however, not only do such coaters tend to be inordinately complex and expensive for many applications, but moreover their proper functioning depends upon the secure positioning of the workpiece.

Aerosol spray techniques are also used in the production of conformal coatings. In operating such systems, however, a high proportion of the discharged coating material is lost to overspray, and there is also a strong tendency for air entrainment; the latter necessitates the allowance of a dwell-time for release of entrapped air, prior to curing of the deposit. In a paper entitled "The UV Curing Process: Applications For Conformal Coating and Adhesives In Electronic Assembly," Hnojewyj et al describe the use of pneumatically atomized spray coating machines for applying and curing UV-curable and heat-curable conformal coatings.

It is known as well in the art to use ultrasonic devices for applying liquids, as evidenced by the following United States patent properties: Sedlacsik, Jr. U.S. Pat. No. 2,881,092; Shizuo Nishiyama et al U.S. Pat. No. 3,114,654; Sedlacsik, Jr. U.S. Pat. No. 3,147,146; Toshio Onishi U.S. Pat. No. 3,198,174; Furgalus et al U.S. Pat. No. 3,966,120; LaBianca U.S. Pat. No. 4,806,455; and Sadler et al SIR No. H153. U.S. Pat. Nos. 4,460,619 and 4,495,885, to Derks et al, disclose an apparatus and method for transporting and depositing viscous materials, in accordance with which the components of a two-part adhesive may be supplied to the opposite sides of an ultrasonically vibrating sonotrode; the ingredients are transported along the sonotrode to the free end of a pin, where they are mixed and thereafter deposited in dropwise fashion.

Drummond patent U.S. Pat. No. 2,450,503 teaches that two substances (i.e., a catalyst and a polymerizable hydrocarbon) may be sprayed simultaneously to intermix just prior to contact with the surfaces being treated. In accordance with Harrison et al U.S. Pat. No. 3,676,197, sprays of (for example) a polyester resin and a peroxide catalyst are caused to converge prior to impinging upon a surface; the patents to Self, U.S. Pat. No. 4,013,614, and to Takegawa et al, U.S. Pat. No. 4,479,840, are similar. Spraying of a catalyst upon a monomer coating is disclosed by Quinlidan, in U.S. Pat. No. 2,684,305.

Despite the activity in the art indicated by the foregoing, the need exists for a fast, reliable, economical, relatively incomplex and environmentally attractive system and method by which a liquid coating material can be applied to one or a multiplicity of separate workpieces, and subsequently cured, so as to produce a high-quality, uniform, and void-free coating thereon, which system and method are readily adapted to existing operations and are sufficiently precise to satisfy applicable coating specifications.

SUMMARY OF THE INVENTION

Accordingly, it is the broad object of the present invention to provide a novel system and method having the foregoing features and advantages.

More specific objects of the invention are to provide such a system and method wherein and whereby the components of a two-part coating composition can be applied to the workpiece in a highly facile manner.

Other more specific objects are to provide such a system and method in which the workpiece may be freely supported upon a transport unit during coating and curing, and in which a conformal coating may be produced, especially on a printed circuit board or wiring assembly.

It has now been found that certain of the foregoing and related objects of the invention are attained by the provision of a system comprised of chassis means (e.g., a frame or stand), ultrasonic coating means, curing means, and transport means. The coating means includes at least one spray head mounted on the chassis means and oriented to vibrate on an axis directed toward the transport means, which axis will usually be substantially vertical. The head has at least one surface that extends substantially in the direction of vibration, and that terminates at one end. The surface receives a liquid coating material, which issues (as a result of vibration of the head) from the "one" end as a spray, covering a predetermined area (Generally taken in a horizontal plane) of substantially constant dimensions. The coating means also includes means for delivering a liquid coating material to the surface of the spray head, and means for ultrasonically vibrating the head. The curing means is disposed on the chassis adjacent the spray head, and will be effective over a second area which is at least equal in width (i.e., in a direction transverse to the direction of movement of the transport means) to the first-mentioned area. The transport means provides unconstraining, underlying support for the workpiece, and is positioned to carry the workpieces along a generally horizontal path portion, past the spray head and through the first-mentioned area, and thereafter past the curing means and through the second area.

In preferred embodiments, the spray head employed will have a second surface that does not intersect or merge with the first-mentioned surface and extends substantially in the direction of vibration, and second means will be provided for delivering liquid coating material to the second surfacer the two surfaces will desirably extend substantially parallel to one another, and will advantageously be planar. The system may consist of two stations, each having a coating section and a curing section, with a device interposed between their respective transport means for transferring and inverting the workpieces. Such a system may be utilized for continuously coating both sides of an object in a single pass, the transfer of which object is facilitated by the absence of structure or elements that constrain the workpieces or that affix them in position on the transport means. Depending upon the nature of the coating material employed, curing may be initiated by actinic (e.g., UV) irradiation and/or by thermal means.

Other objects of the invention are attained by the provision of a method in which may be used a system of the character described, and a radiation-curable coating material. The workpieces are freely disposed on the transport means, in spaced relationship to one another in the direction of the travel path, and are transported sequentially through the first and second areas defined. The coating material is delivered to the surface of the spray head, which may, in certain embodiments, be activated only when a workpiece lies substantially within the "first" area; the curing means is desirably operated continuously.

Normally, each workpiece will be exposed to curing conditions immediately subsequent to coating, either by continuous or intermittent operation of the transport means. When operation is continuous (e.g., using a conventional conveyor), means may be provided for sensing the proximity of a workpiece, and for causing the coating means to commence spraying substantially upon entry of a workpiece into the coating area, and to terminate spraying substantially upon its exit therefrom.

A two-part composition will preferably be utilized for coating, in which instance the spray head will have two, non-intersecting surfaces, as described, with one of the components being delivered to each. The disposition of the spray head surfaces will be such as to permit interspersion of the two parts of the composition at a location outwardly of the end of the head, but at a distance spaced sufficiently from the transport means so that the combination thereof takes place prior to contact with the workpieces. The method will be employed to particular advantage in producing conformal coatings upon printed circuit boards, using two-part coating compositions that are most desirably of non-stoichiometric character and react through a radical ionic mechanism.

DETAILED DESCRIPTION OF THE ILLUSTRATED EMBODIMENTS

Figure 1:
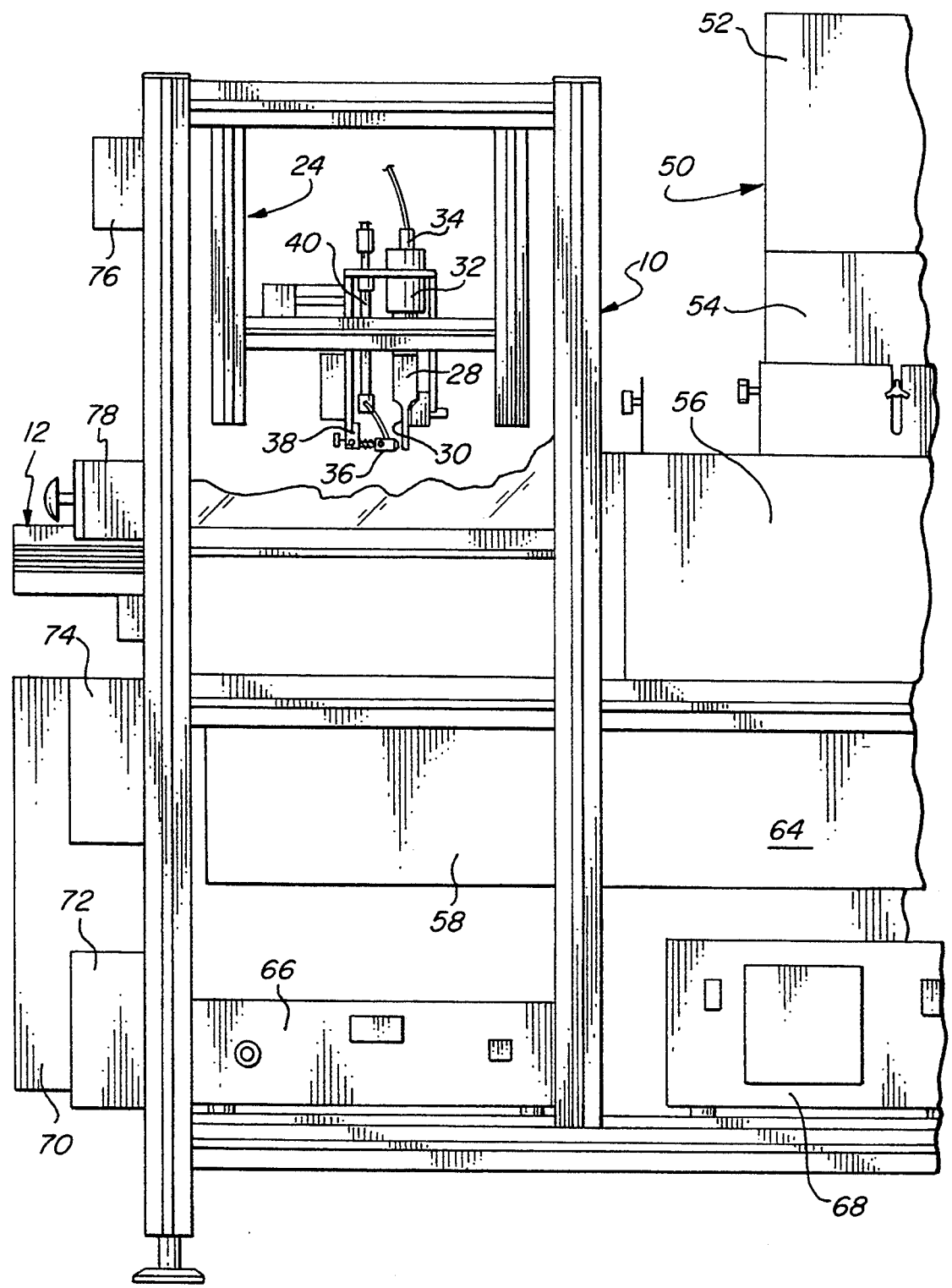
FIG. 1 is a fragmentary, side elevational view of a system embodying the present invention.
Figure 2:
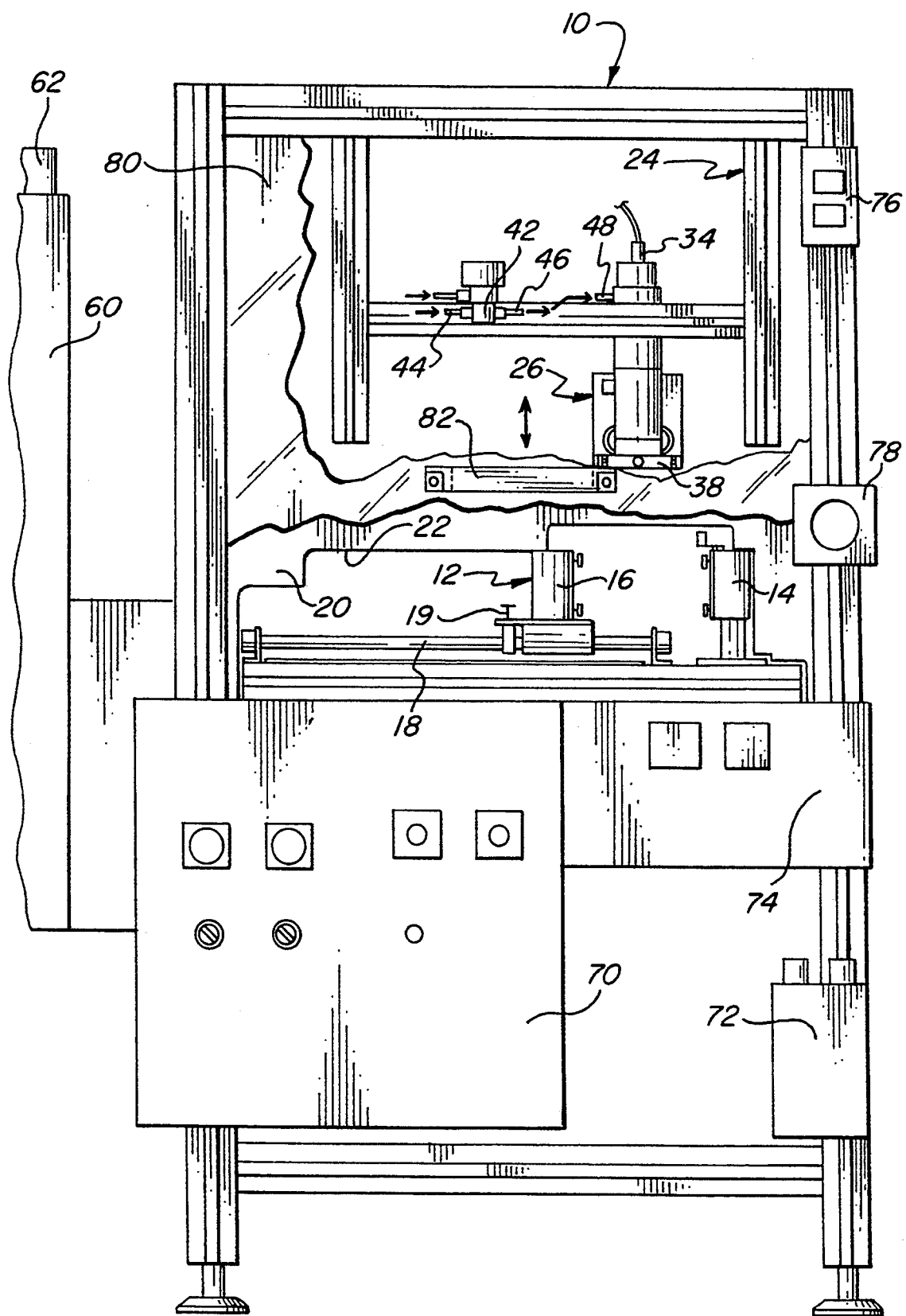
FIG. 2 is a fragmentary end view of the system, at the loading position.

Turning initially to FIGS. 1 and 2 of the drawings in detail, therein illustrated is a coating system embodying the present invention, which system is now available commercially, under the trademark EXACTCOAT, from Dymax Corporation, of Torrington, Conn., the assignee of the present invention. The station in the Figures shown consists of a stand or frame, generally designated by the numeral 10, through which extends a conveyor generally designated by the numeral 12. The conveyor is of the so-called "edge roller" type (available from Process Control Technologies, Inc., of Brookfield, Ill.), and consists of a fixed mechanism 14 and a cooperating, adjustable mechanism 16, the latter being slidably mounted upon transverse rods 18 (only one of which is shown) to enable variation of the effective width of the conveyor; clamping fixture 19 is provided on the housing of the mechanism 16 for securing it in any selected position. An enclosed spray compartment (normally comprised of transparent panels) is partially defined by a rearward wall 20, which is provided with a compound opening 22 to receive the conveyor 12 and accommodate its full range of effective width variation.

Contained within the spray compartment is a subframe structure, generally designated by the numeral 24, on which is supported stationarily an ultrasonic spray assembly, generally designated by the numeral 26 and commercially available from Ultrasonic Systems and Engineering, Inc., of Kingston N.Y. The assembly 26 consists of a head oriented to vibrate on a vertical axis and having planar opposite side vertical surfaces 30, the head being driven by an ultrasonic generator 32 electrically connected (by means only suggested) through coupling 34 to a power supply 66. The spray assembly 26 also includes a nozzle 36 for delivery of a liquid coating material to the facing surface 30 on the head 28, which is adjustably supported on a mounting flange 38 and is fed through a conduit 40. The coating liquid is supplied from a pressure vessel to the nipple 44 on the inlet side of valve 42, the outlet nipple 46 of which is in communication with the nipple 48 of the conduit 40 (neither the pressure vessel nor the flow conduits described are illustrated).

Disposed directly adjacent the spray compartment is an irradiation unit, generally designated by the numeral 50 and commercially available from Fusion Systems Corporation, of Rockville, Md. The unit 50 consists of a blower 52 and a radiation source 54, the latter typically taking the form of an ultraviolet lamp; a power supply 68 is provided for the unit, as is structure 56 for effectively shielding the source 54. Exhaust plenums 58 and 64 are associated with the coating section and the curing section, respectively, and are connected through the blower 60 to a vent 62. The system includes a main control cabinet 70, as well as enclosures at 72 and 74 for electrical connections, circuit breakers, and the like. Box 76 contains electrical switches for the conveyor and the blower, and an emergency switch 78 is provided for deactivating the entire system. A panel 80, having a handle 82, is slidably mounted in the frame 10 and completes the spray compartment enclosure at the loading position.

Figure 3:
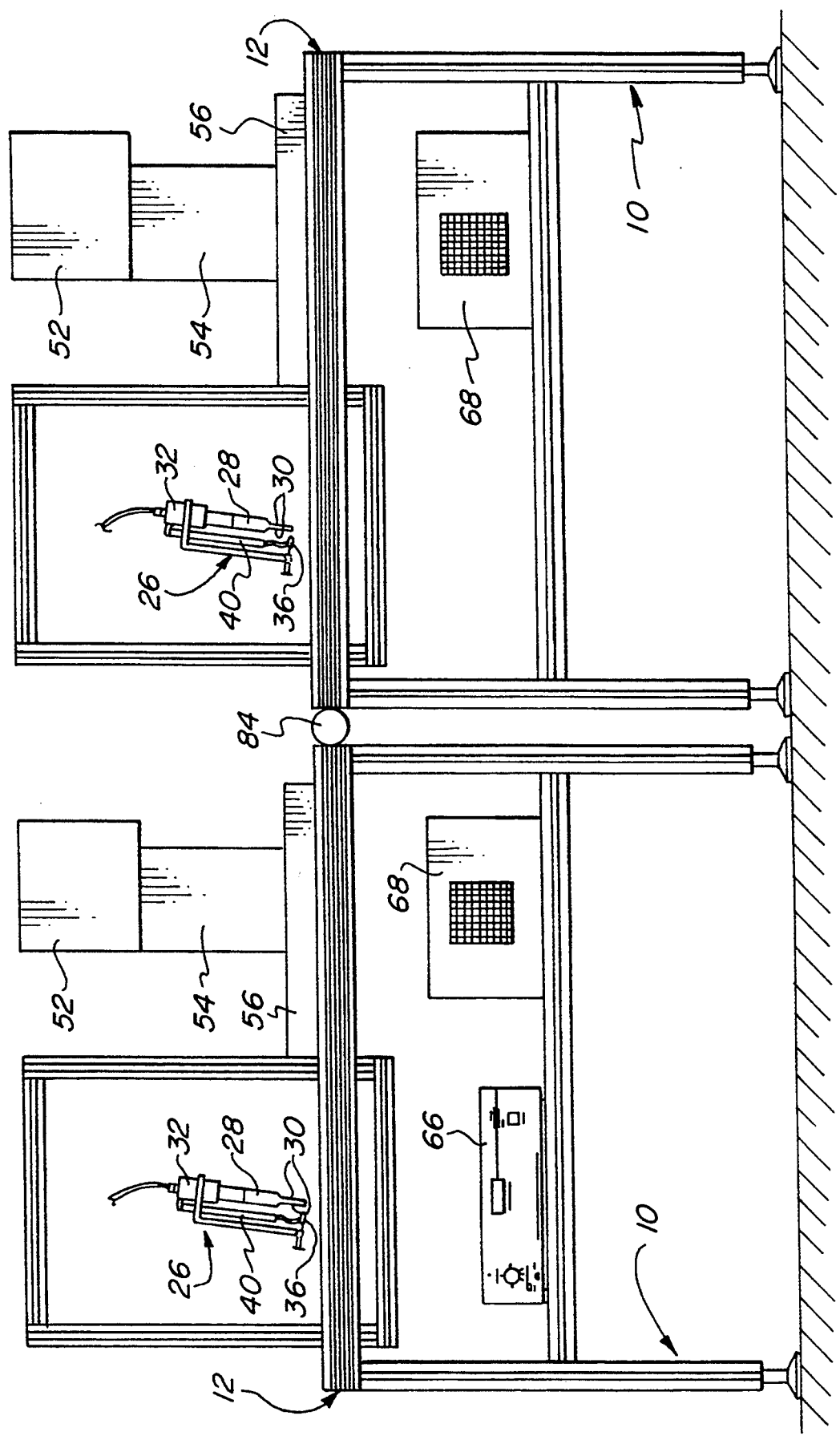
FIG. 3 is a diagrammatic, side elevational view of a system embodying the invention, consisting of two coating and curing stations having conveyors disposed end-to-end with a transfer device interposed therebetween.

The system depicted in FIG. 3 consists of two stations, as hereinabove described, disposed in endwise alignment and with the exit end of the conveyor 12 of the more upstream station adjacent the entrance end of the conveyor of the more downstream station. An interposed transfer device (a so-called "flipper") serves to remove the workpieces from the upstream conveyor and to load them onto the downstream one, inverting them from one side to another in effecting the transfer. The system of FIG. 3 is of course intended for use in coating both sides of a workpiece in a single pass; e.g., to produce an encapsulating conformal coating on a PCB.

It will be appreciated that the necessary transfer action is greatly facilitated by the absence of physical constraints upon the workpieces. The coating of both sides is also facilitated because curing of the deposited material can occur immediately, and without need for any dwell time. Despite these advantages, it will be understood that each station (e.g., as depicted in FIGS. 1 and 2) of which the system of FIG. 3 consists is capable of operation wholly independently of the other, and embodies the basic concepts of the invention.

Figure 4:
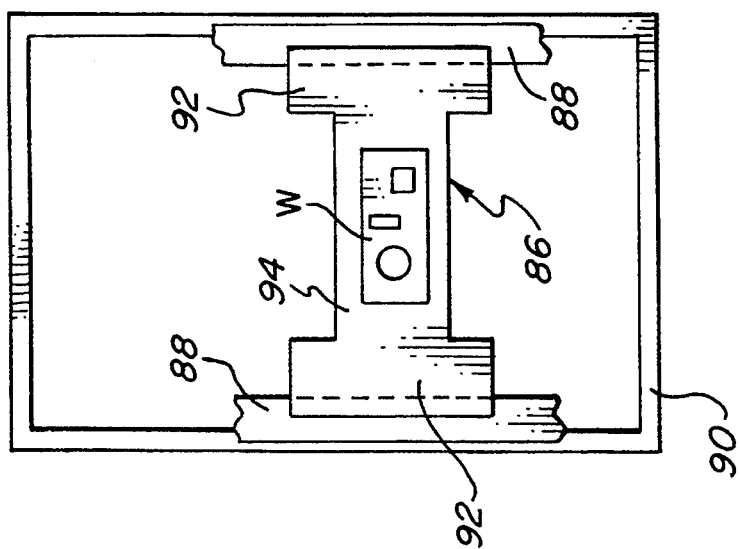
FIG. 4 is a fragmentary, plan view showing a workpiece supported upon an underlying carrier plate which is, in turn, frictionally engaged along its opposite end margins by elements of a conveyor.

FIG. 4 diagrammatically illustrates means by which workpiece "W" may be supported and transported through the system, utilizing a conveyor in combination with a simple carrier plate, generally designated by the numeral 86. The conveyor is depicted to have edge belts 88, which receive and frictionally engage transversely spaced marginal portions 92 of the plate 86 (as would the rollers of the previously-described conveyor mechanism), with the central portion 94 of the plate providing underlying support for the workpiece W, which rests freely thereupon. A container 90 is disposed beneath the conveyor, and serves to catch any overspray that might not deposit upon the workpiece or the carrier plate (which material may be reused under certain circumstances).

Figure 5:
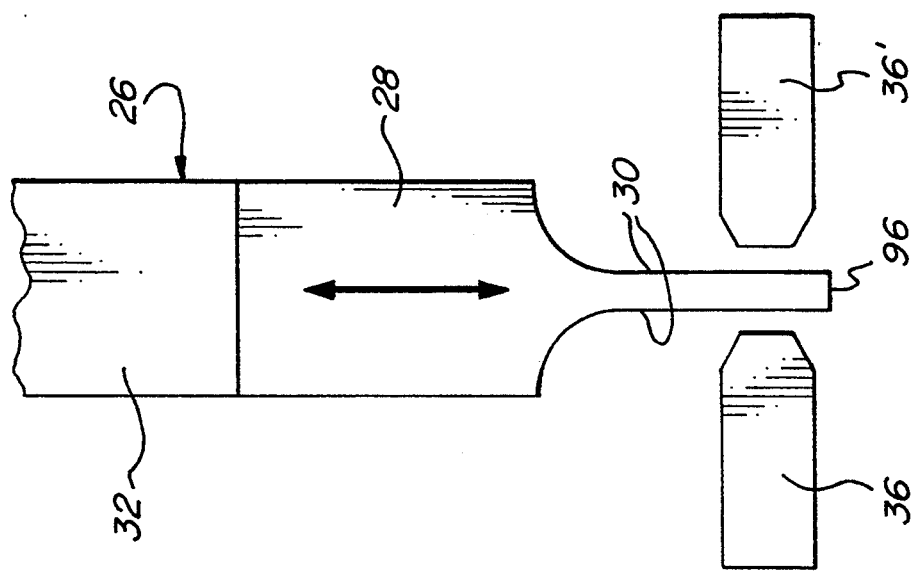
FIG. 5 is a fragmentary, diagrammatic view of ultrasonic coating means suitable for use in the system and method hereof.

Turning finally to FIG. 5, a unique arrangement is illustrated by which two different liquid coating materials (i.e., the components of a two-part coating system) can be discharged simultaneously from the spray head 28. Each component is delivered to one of the opposite faces 30 through either of the nozzles 36, 36'; it thereafter migrates along the surface under the influence of ultrasonic vibrational forces (which occur along the axis indicated by the doubleheaded arrow), and issues from the free end at one of the corners formed with the transverse (normally, horizontal), planar bottom end surface 96. The resultant adjacent sprays of atomized liquid converge and intersperse at a point outwardly of the end surface 96, to combine and thereafter deposit upon the workpiece as a complete formulation.

It will be appreciated that the head 28, and consequently the surfaces 30, are of a width that is so selected as to create a zone of spray that corresponds to the width (i.e., dimension across the conveyor path) of the area to be coated, so as to fully encompass the workpiece. If the workpiece dimension necessitates doing so, moreover, a plurality of spray heads can be "ganged" laterally across the travel path so as to produce an adequate spray zone; Generally, the width of the spray will range from about 1.9 to 60 centimeters, and the head surface need be neither truely planar nor vertical. Thus, although a head having vertically disposed, planar surfaces, is illustrated, it will be appreciated that the surfaces may be curvilinear (e.g., to produce a conical spray pattern), that they may converge toward or diverge from one another, and that they may be oriented as much as 45° off-vertical.

Many other variations can of course be made to the system of the invention, and to the components of which it is comprised, without departure from the scope of the instant concepts. It has been indicated previously, for example, that various forms of transport means may be employed; thus, a rotating timing, or indexing, table may be employed rather than the linear-moving conveyors described. Although the requisite coating pattern can usually be achieved simply by proper correlation of the size of the spray head (or heads) to the workpiece, air knives or the like may be provided for added control if so desired. In addition, the system may include solenoid valves, pressure regulators, heaters, temperature/viscosity control units, filtration devices, and the like, and it will be understood that reference herein to specific equipment, available from specific vendors, is made only for purposes of description and is not to be taken in a limiting sense.

Virtually any chemical species of polymerizable liquid coating material (e.g., epoxies, vinyls, urethanes) can be employed in the practice of the present method, as long as is capable of producing a spray under the selected conditions of atomization, and is capable of curing to produce the desired resinous surfaces. A primary criterion in this regard will generally concern the viscosity of the liquid, which typically will have a value in the range 80 to 500 centipoise at 25° Centigrade, albeit that heating may be necessary to lower the viscosity (e.g., to 50 centipoise or less) for actual application. The coating composition, as deposited upon the workpiece, will desirably be capable of cure-initiation by actinic (e.g., UV, visible light, election beam) radiation; in certain instances, however, thermal activation may be employed alone or in combination therewith, and this may be particularly so when shadow curing (e.g., curing in areas effectively masked by components of a printed circuit board) is required.

Especially desirable coatings are often produced from UV-curable acrylate compositions, most desirably applied by non-pneumatic atomizing means (e.g., ultrasonically) as two simultaneously sprayed and spatially combined components, as hereinabove described. In any event, it is believed that best results are achieved when the cure reaction takes place through other than a conventional free-radical mechanism, wherein the growing polymer chains will tend to self-terminate, or quench themselves.

More specifically, it is most desirable to employ a non-stoichiometric composition (i.e., a composition in which the components achieve full curing despite being combined in amounts that are not stoichiometrically equivalent); especially preferred are compositions that cure through an ionic (especially cationic) mechanism. Needless to say, when a two-part chemical composition is discharged from a single spray head, the components should be so formulated as to properly interreact when combined in approximately equal volumes.

Thus, it can be seen that the present invention provides a coating system and method by which a liquid coating material can be applied to a multiplicity of separate workpieces in a manner that is fast, reliable, economical, and flexible, so as to produce a high-quality coating that is uniform and free from voids. The system and method of the invention are sufficiently precise and environmentally attractive to satisfy applicable specifications, and are especially well suited for the facile application of the components of a two-part coating composition. Because of the application technique, moreover, the workpieces can be freely supported upon transport means during coating and curing, without need for any means to position them and/or to affix them in place, and the avoidance of air entrainment permits curing of the deposit immediately after application; the system and method are especially well adapted for the production of conformal coatings on printed circuit boards and the like.

Having thus described the invention, what is CLAIMED is:

1. In a method for coating a workpiece, the steps comprising:
   (a) providing a system including:
      (I) support means; and
      (II) ultrasonic coating means including:
         (1) at least one spray head mounted on said support means and oriented to vibrate on an axis, said head having first and second, non-intersecting surfaces, extending substantially in the direction of vibration and terminating at one end of said head, for receiving and causing to issue from said one end, as atomized sprays, liquid coating materials delivered thereto, said head being so dimensioned and configured as to cause the sprays to intersperse and initially combine outwardly of said one end, and together to cover a first area of substantially constant dimensions intersected by said axis;
         (2) means for ultrasonically vibrating said spray head on said axis; and
         (3) first and second delivery means for delivering a liquid coating material to said first and second surfaces of said spray head;
   (b) operating said delivery means to effect simultaneous delivery of a liquid coating material to each of said first and second surfaces of said spray head;
   (c) disposing a workpiece in spaced relationship to said one end, within said first area; and
   (d) operating said coating means so as to cause it to vibrate on said axis and to thereby cause a spray to issue separately from each of said first and second surfaces at said one end of said head, and to cause said sprays to so intersperse and combine and to deposit together upon said workpiece, said coating material delivered to said one surface comprising one part of a two-part composition, and said coating material delivered to said second surface comprising the other part thereof.

2. The method of claim 1 wherein said composition is of a non-stoichiometric character.

3. The method of claim 2 wherein said composition cures by a radical ionic mechanism.

4. The method of claim 1 wherein said first and second surfaces of said spray head are disposed in substantially parallel planes, and wherein said head has a substantially planar surface at said one end that is substantially perpendicular to said first and second surfaces.

5. A method for coating a multiplicity of separate workpieces, comprising the steps:
   (a) providing a system comprising:
      (I) chassis means;
      (II) workpiece transport means;
      (III) ultrasonic coating means including:
         (1) at least one stationary spray head mounted on said chassis means and oriented to vibrate on an axis directed toward said transport means, said head having first and second, non-intersecting surfaces extending substantially in the direction of vibration and terminating at one end of said head, for receiving and causing to issue from said one end, as atomized sprays, liquid coating materials delivered thereto, said head being so dimensioned and configured as to cause the sprays to cover a first area of substantially constant dimensions intersected by said axis;
         (2) means for ultrasonically vibrating said spray head on said axis; and
         (3) first and second delivery means for delivering liquid coating material to said surfaces of said spray head; and
      (IV) irradiation means disposed on said chassis directly adjacent said coating means, for irradiating a second area; said transport means providing underlying support for workpieces and being positioned to convey them thereon along a generally horizontal path portion past said spray head and through said first area, and thereafter past said irradiation means and through said second area, said second area being at least equal in width to said first area, taken across said path portion; whereby a cured coating can be produced upon each of a multiplicity of workpieces during transport through said system;
   (b) disposing a multiplicity of workpieces on said transport means, in spaced relationship to one another in the direction of said path portion;
   (c) effecting operation of said transport means so as to convey said workpieces along said path portion, sequentially through said first and second areas;
   (d) operating said first and second delivery means to effect delivery simultaneously of coating material to said first and second surfaces of said spray head, and operating said coating means so as to cause it to vibrate on said axis and to produce sprays covering said first area when a workpiece is within said first area, so as to deposit a coating thereon, said coating material being subject to cure initiation by exposure to radiation produced by said irradiation means; and
   (e) operating continuously said irradiation means so as to initiate curing of said coating material within said second area.

6. The method of claim 5 wherein said transport means provides unconstraining workpiece support, and is continuously operated so as to expose each of said workpieces to irradiation in said step (e) immediately subsequent to coating thereof in said step (d).

7. The method of claim 6 wherein said system includes means for sensing the proximity of a workpiece to said first area and for effecting operation of said coating means in accordance with said step (d), said means for sensing and effecting operation serving to initiate operation of said coating means substantially upon the entry of a workpiece into said first area, and to terminate operation thereof substantially upon exiting of the workpiece therefrom.

8. The method of claim 5 wherein a two-part, radiation-curable composition is utilized for coating of said workpieces, and wherein said coating material delivered to said first surface comprises one of the parts of said composition and said coating material delivered to said second surface comprises the other part thereof, said surfaces of said head being so disposed as to permit interspersion of said two parts of said composition adjacent said one end of said head and initial combination of said parts spaced outwardly thereof, said head being spaced from said transport means a distance sufficient to enable such interspersion to occur prior to contact of said sprays with said workpieces.

9. The method of claim 8 wherein said composition produces a conformal coating upon each workpiece.

10. The method of claim 9 wherein said composition is of non-stoichiometric character.

11. The method of claim 10 wherein said composition cures by a radical cationic mechanism.

12. The method of claim 5 wherein said axis is substantially vertically oriented.

13. The method of claim 7 wherein said head has opposite sides, said first and second surfaces being disposed on said opposite sides in parallel planes, and has a planar end surface at said one end to which said first and second surfaces are perpendicular.

14. The method of claim 13 wherein said transport means comprises a first conveyor having a loading end and an unloading end, wherein said system includes a second conveyor having a loading end and an unloading end, for conveying the workpieces along a generally horizontal second path portion, said second conveyor being disposed with its loading end adjacent said unloading end of said first conveyor, and wherein said system includes a transfer device operatively disposed between said two conveyors for transferring the workpieces from said first conveyor to said second conveyor, and in doing so for inverting the workpieces, from one side to another, said method including the step of operating said second conveyor and said transfer device so as to transfer said workpieces from said first conveyor to said second conveyor, and to convey said workpieces along said second path portion.

15. The method of claim 14 additionally including second ultrasonic coating means and second irradiation means disposed directly adjacent one another along said second path portion, said second coating means and said second irradiation means having the features, respectively, of said coating means and irradiation means previously recited, and being operated to produce a coating upon said workpieces, whereby a cured coating can be produced on both sides of the workpieces in a single pass.

* * * * *